(12) United States Patent
Sarin et al.

(10) Patent No.: US 8,213,233 B2
(45) Date of Patent: Jul. 3, 2012

(54) REDUCTION OF QUICK CHARGE LOSS EFFECT IN A MEMORY DEVICE

(75) Inventors: Vishal Sarin, Cupertino, CA (US); William Saiki, Mountain View, CA (US); Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/236,765

(22) Filed: Sep. 20, 2011

(65) Prior Publication Data
US 2012/0008409 A1 Jan. 12, 2012

Related U.S. Application Data

(63) Continuation of application No. 12/195,552, filed on Aug. 21, 2008, now Pat. No. 8,027,200.

(51) Int. Cl.
*G11C 11/34* (2006.01)

(52) U.S. Cl. .......... 365/185.17; 365/185.19; 365/185.22
(58) Field of Classification Search ............ 365/185.17, 365/185.19, 185.22, 185.09
See application file for complete search history.

(56) References Cited

U.S. PATENT DOCUMENTS

| 6,580,643 | B1 * | 6/2003 | Satoh et al. | 365/185.22 |
| 7,619,933 | B2 * | 11/2009 | Sarin | 365/185.28 |

* cited by examiner

*Primary Examiner* — Jason Lappas
(74) *Attorney, Agent, or Firm* — Leffert Jay & Polglaze, P.A.

(57) ABSTRACT

Methods for reducing quick charge loss effects, methods for programming, memory devices, memory devices, and memory systems are disclosed. In one such method, a programming pulse is applied to the word line to increase the threshold voltage of the memory cells being programmed. A negative voltage pulse is applied to the word line after the programming pulse to force any electrons trapped in the tunnel oxide of memory cells being programmed back into the tunnel region. After the negative pulse, a program verify operation is performed.

18 Claims, 7 Drawing Sheets

REDUCTION OF QUICK CHARGE LOSS EFFECT IN A MEMORY DEVICE

RELATED APPLICATION

This is a continuation of U.S. patent application Ser. No. 12/195,552 (allowed), filed Aug. 21, 2008 now U.S. Pat. No. 8,027,200 and titled "REDUCTION OF QUICK CHARGE LOSS EFFECT IN A MEMORY DEVICE," which is commonly assigned and incorporated herein by reference.

TECHNICAL FIELD

The present invention relates generally to memory devices and in a particular embodiment the present invention relates to non-volatile memory devices.

BACKGROUND

Memory devices can include internal, semiconductor, integrated circuits in computers or other electronic devices. There are many different types of memory including random-access memory (RAM), read only memory (ROM), dynamic random access memory (DRAM), static RAM (SRAM), synchronous dynamic RAM (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

During a typical prior art programming operation of a flash memory cell, a selected word line coupled to the selected memory cell to be programmed is biased with a series of incrementing voltage programming pulses that start at an initial voltage that is greater than a predetermined programming voltage (e.g., approximately 16V). The programming pulse increases a charge level, thereby increasing the cell's threshold voltage $V_t$, on a floating gate of the memory cell. After each programming pulse, a verification operation with a word line voltage of 0V is performed to determine if the cell's threshold voltage has increased to the desired programmed level.

Immediately after programming, the floating gate can experience multiple forms of charge loss that occur at the time of ion implantation that can cause defects in the data retention characteristics of the floating gate. These include single bit charge loss, intrinsic charge loss, and quick charge loss.

Single bit charge loss is the result of a defective memory cell that exhibits electron leakage. This leakage can be accelerated with voltage or high temperature stress and results in inferior data retention.

Intrinsic charge loss is an immediate leakage of electrons from the floating gate, closest to the tunnel oxide, after a programming pulse. The trapped charge initially causes the cell $V_t$ to appear higher than the floating gate is programmed. The leakage of these electrons after programming then causes a one time shift in the threshold voltage.

Quick charge loss also causes an immediate $V_t$ shift after a programming pulse. Quick charge loss is the result of electrons trapped in the tunnel oxide layer after the programming pulse moving back into the channel region. When a cell passes the verify operation, the programmed threshold voltage appears to be higher due to the trapped charge in the tunnel oxide. When the cell is read after the program operation has been completed, the cell has a $V_t$ that is lower than the $V_t$ obtained during the program verify operation due to the charge in the tunnel oxide leaking out to the channel region. This can require an enlargement of the $V_t$ distribution in order to accommodate all possible threshold voltages for a given state.

Figure 1:
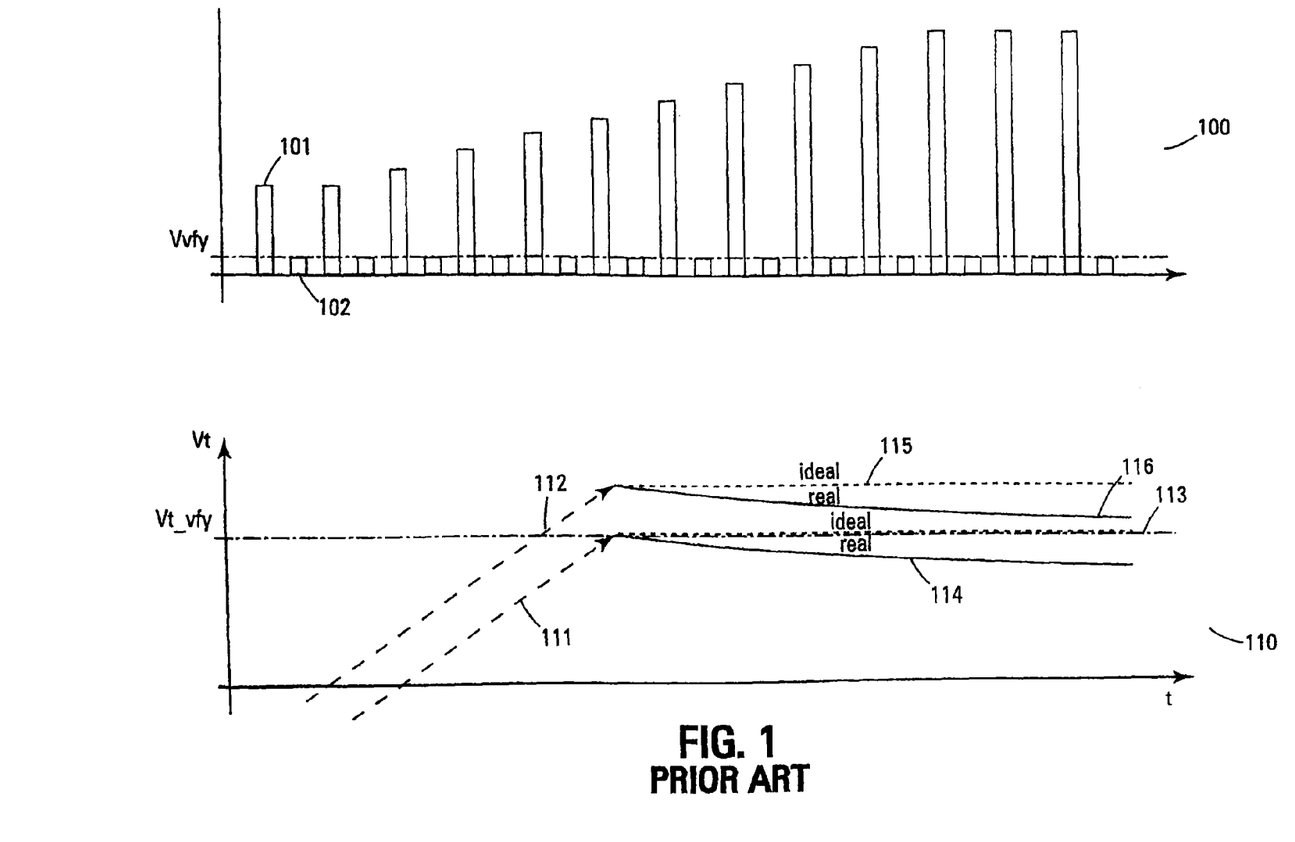
FIG. 1 shows a plot of $V_{WL}$ versus time of a typical prior art programming operation with the accompanying real and ideal $V_t$ of the target cell.

FIG. 1 shows a plot of $V_{WL}$ versus time of a typical prior art programming operation with the accompanying real and ideal minimum/maximum threshold voltage of the target cell. The upper plot 100 shows the series of incrementally increasing programming pulses 101 being applied to the target cell as the word line voltage $V_{WL}$. After each programming pulse 101, a verify pulse 102 occurs at a $V_{vfy}$ level.

Figure 2:
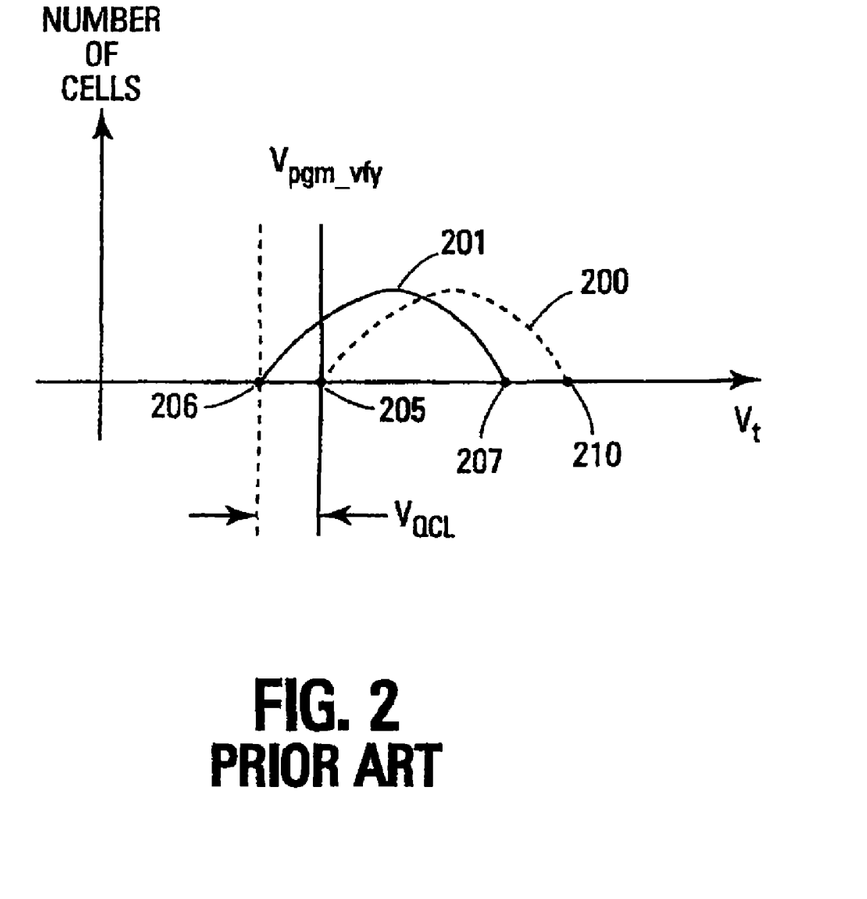
FIG. 2 shows a typical prior art $V_t$ distribution, in accordance with FIG. 1, that has been affected by quick charge loss.

The lower plot 110 shows the resulting $V_t$ of the target cell being programmed. The top $V_t$ plot 112, 116 is the maximum threshold voltage and the lower $V_t$ plot 111, 114 is the minimum threshold voltage as illustrated in FIG. 2. As the programming pulses 101 of the first plot 100 are applied to a target cell control gate, the $V_t$ 111, 112 increases to approximately the $V_{t\_vfy}$ level. Once at this level, the target cell is verified and inhibited from further programming. The ideal $V_t$ 113, 115 is shown staying level at $V_t$. However, the real $V_t$ 114, 116 of the target cell begins to decrease almost immediately after the last programming pulse.

FIG. 2 illustrates a typical prior art $V_t$ distribution of memory cells programmed in the manner shown in FIG. 1 to a particular programmed state. In FIG. 2, the dotted line 200 represents the ideal distribution while the solid line 201 represents the real distribution. The lower end 205 of the ideal distribution 200 corresponds to memory cells having a $V_t$ in accordance with plot 113 of FIG. 1 and the upper end 210 of the ideal distribution 200 corresponds to memory cells having a $V_t$ in accordance with plot 115. Similarly, the lower end 206 of the real distribution 201 corresponds to memory cells having a $V_t$ in accordance with plot 114 and the upper end 207 of the real distribution 201 corresponds to memory cells having a $V_t$ in accordance with plot 116.

The cells at the lower end of the ideal distribution 200 are verified at the $V_{pgm\_vfy}$ voltage. After the programming operation and subsequent inhibition of those cells, the distribution shifts in the negative direction by an amount equal to $V_{QCL}$ and ends at the lower $V_t$ 206. Such a shift in the distribution would necessitate an enlarged distribution that starts at the real lower $V_t$ 206 and extends to the ideal upper $V_t$ 210.

In a single level cell (SLC), a $V_t$ distribution enlargement does not have much affect on the reading of a programmed memory cell. However, in a multiple level cell (MLC) memory cell, the state distributions are typically more closely spaced in order to fit all of the states within a low supply voltage range. Enlarging the $V_t$ distributions in an MLC device can thus reduce the number of states that are programmable into the device. Additionally, the enlarged $V_t$ distributions can overlap and result in errors in reading the different states.

For the reasons stated above, and for other reasons stated below that will become apparent to those skilled in the art upon reading and understanding the present specification, there is a need in the art to reduce the effects of charge loss in a memory device.

DETAILED DESCRIPTION

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 3:
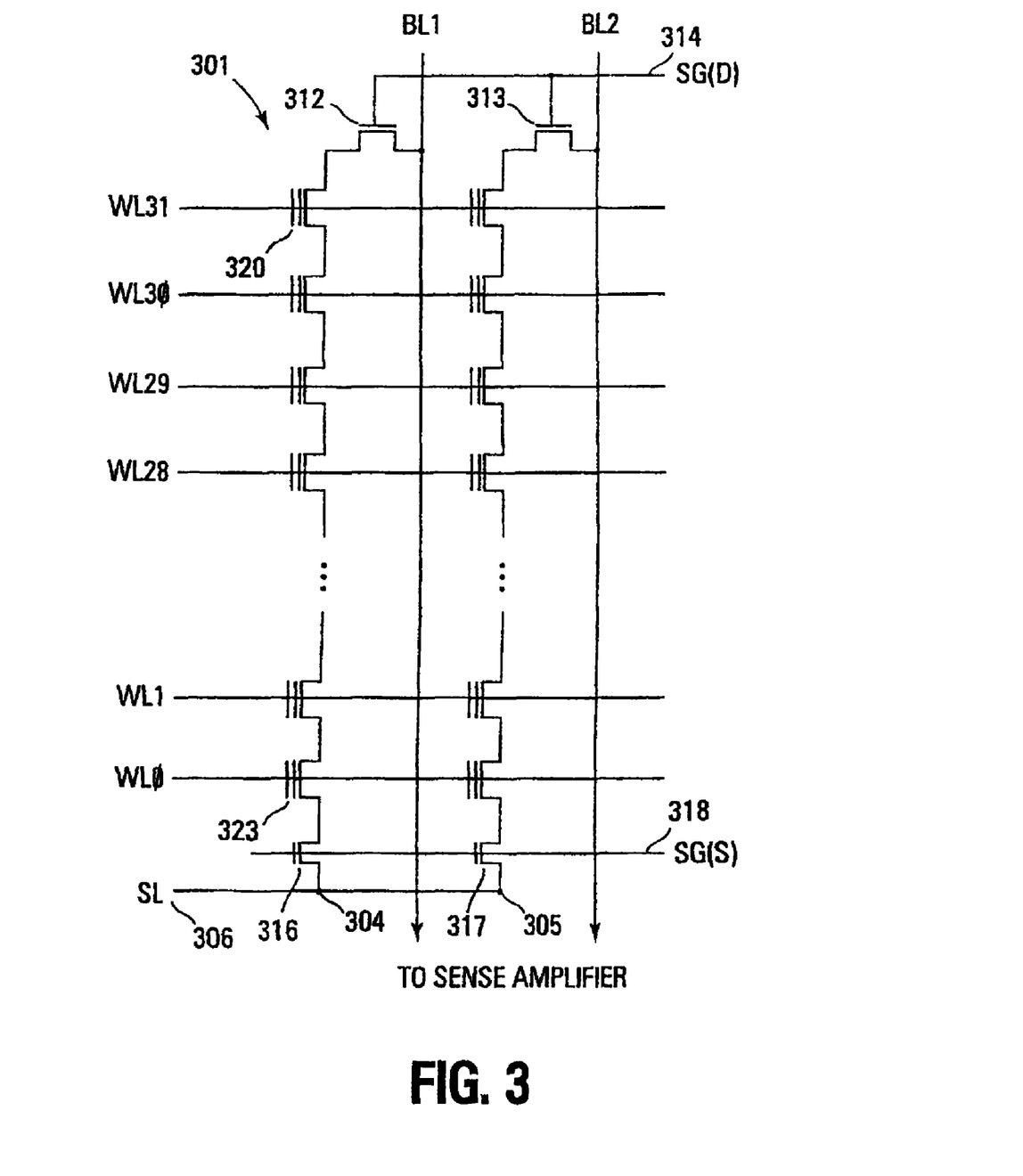
FIG. 3 shows schematic diagram of one embodiment of a portion of a memory array.

FIG. 3 illustrates a schematic diagram of a portion of a NAND architecture memory array 301 comprising series strings of non-volatile memory cells on which one embodiment of the method for charge loss compensation can operate. While the subsequent discussions refer to a NAND memory device, the present embodiments are not limited to such an architecture but can be used in other memory device architectures as well.

The array comprises an array of non-volatile memory cells 301 (e.g., floating gate) arranged in columns such as series strings 304, 305. Each of the cells 301 are coupled drain to source in each series string 304, 305. An access line (e.g. word line) WL0-WL31 that spans across multiple series strings 304, 305 is connected to the control gates of each memory cell in a row in order to bias the control gates of the memory cells in the row. Data lines, such as bit lines BL1, BL2 are coupled to the strings and eventually connected to sense amplifiers (not shown) that detect the state of each cell by sensing current on a particular bit line.

Each series string 304, 305 of memory cells is coupled to a source line 306 by a source select gate 316, 317 and to an individual bit line BL1, BL2 by a drain select gate 312, 313. The source select gates 316, 317 are controlled by a source select gate control line SG(S) 318 coupled to their control gates. The drain select gates 312, 313 are controlled by a drain select gate control line SG(D) 314.

Each memory cell can be programmed as a single level cell (SLC) or multilevel cell (MLC). Each cell's threshold voltage ($V_t$) is indicative of the data that is stored in the cell. For example, in an SLC, a $V_t$ of 0.5V might indicate a programmed cell while a $V_t$ of −0.5V might indicate an erased cell. The MLC may have multiple $V_t$ ranges that each indicate a different state. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

In an MLC device, each word line of memory cells typically stores two pages of data, an upper page of data and a lower page of data. This concept is illustrated in the $V_t$ distribution of FIG. 4. This figure illustrates one embodiment of $V_t$ versus the number of cells in each programmed or erased state.

Figure 4:
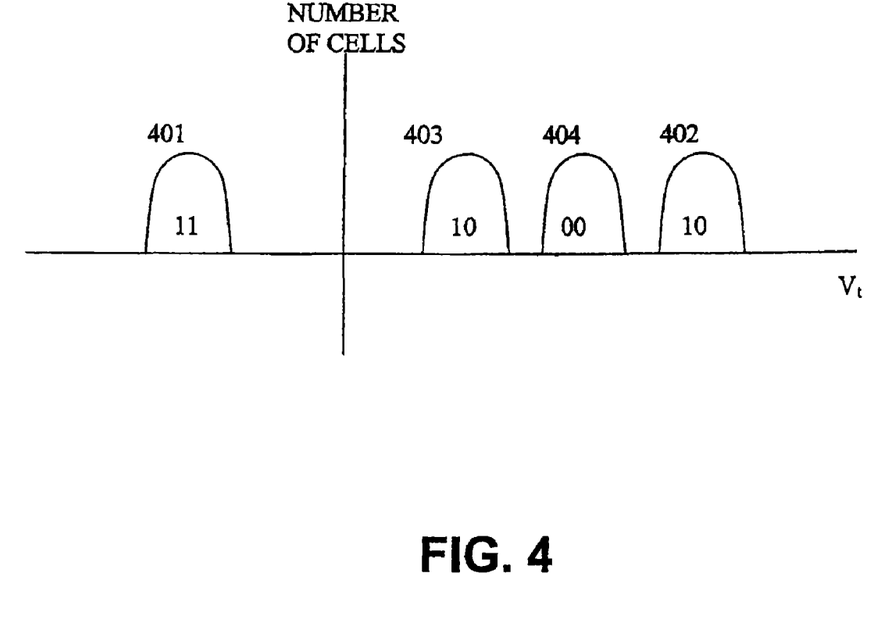
FIG. 4 shows one embodiment of a $V_t$ distribution of a memory cell in accordance with the memory array of FIG. 3.

This diagram shows that the logical 11 state 401 is the most negative state and is typically referred to as the erased state. The logical 10 state 402 is the most positive state. The logical 01 state 403 and the logical 00 state 404 are located between the most negative and most positive states 401, 402. Each logical state of FIG. 4 comprises an upper page and a lower page. For example, in the 01 logical state 403, the logical 1 could be referred to as the upper page of data and the logical 0 could be referred to as the lower page of data. Alternate embodiments could reverse these labels. The pages of data can also be referred to as odd and even pages of data. The states of FIG. 4 are for purposes of illustration only as the present embodiments may assign different logical states to each threshold voltage distribution.

In programming a memory cell, a threshold voltage distribution is moved from one state 401-404 to another. For example, a flash memory cell typically starts in the erased state 401. The cell's threshold voltage is increased by the application to the cell control gate of a series of incrementally increasing programming pulses that start at an initial, high voltage (e.g., approximately 16V) and increase by a step voltage (e.g., 1.0V) until the cell is programmed or a program error condition occurs.

The programming method for reducing the effects of quick charge loss, discussed subsequently, uses a negative bias on the selected word line prior to the program verify pulse. This forces the trapped electrons out of the tunnel oxide more quickly, thus reducing the effective threshold voltage of the memory cell being programmed.

Figure 5:
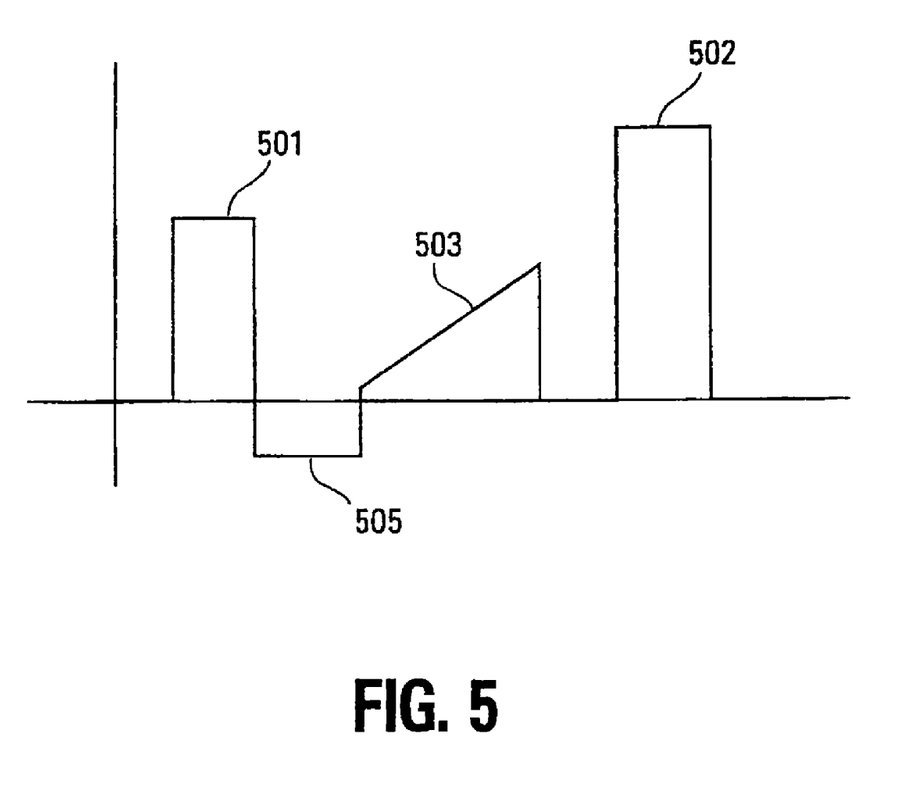
FIG. 5 shows the programming, verify, and negative bias pulses in accordance with the programming embodiment of FIG. 6.

The signal diagram of FIG. 5 illustrates the incrementally increasing programming pulses 501, 502 with the intermediate program verify ramped pulse 503 between each programming pulse 501, 502. The negative biasing pulse 505 occurs prior to the verify ramped pulse 503.

The program verify operation, in one embodiment, is a read of a cell to determine its stored voltage level and a comparison of that voltage level with a target voltage level. In a typical program verify operation, an enable voltage in the range of 0.2-1.2V is applied to the bit line. The selected word line has a ramp voltage pulse applied and unselected word lines are held at ground potential. As the ramped verify voltage increases, the selected cell turns on when the verify voltage becomes equal to the stored voltage of the selected memory cells. This couples the selected cells to sense amplifiers for reading/verifying the programmed status of the cells. As a result of the program verify operation, the memory cells at or above the target verify level are considered to be programmed while the memory cells below the target verify level are not programmed.

Figure 6:
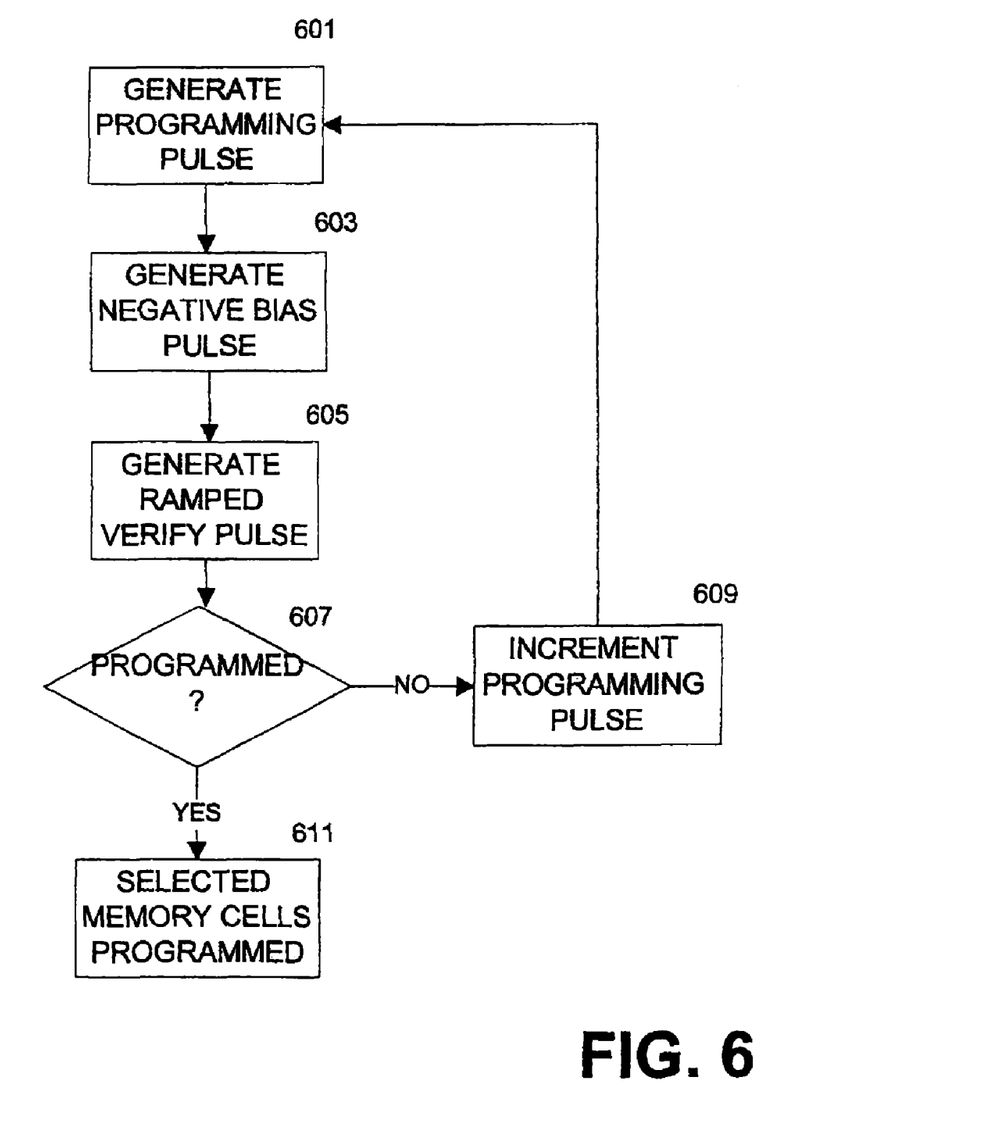
FIG. 6 shows a flowchart of one embodiment of a method for programming that incorporates quick charge loss effect reduction in a memory device.

FIG. 6 illustrates a flowchart of one embodiment of a method for programming selected memory cells while reducing the effects of quick charge loss. A programming pulse is generated 601 and applied to the selected word line that is coupled to memory cells that are being programmed.

Subsequent to the programming pulse and prior to the verify pulse, a negative pulse is generated and applied to the selected word line 603. In one embodiment, this pulse is in the range of −5V to −6V. However, alternate embodiments can use any voltage that has a magnitude less than that required to erase the memory cell.

A negative bias on the control gate of a memory cell being programmed forces the electrons that are trapped in the tunnel oxide back into the channel region. Thus, during the verify operation, only the charge on the floating gate remains to affect the measurement of the threshold voltage.

After the negative voltage pulse 603, the program verify is performed by the generation of a ramped verify pulse 605. As described previously, the ramped voltage causes a memory cell being programmed to turn on when the ramp voltage reaches the voltage that is stored in the memory cell. If the memory cell successfully verifies 607 as being programmed, the programming operation is complete for the selected memory cells 611.

If the verify operation is not successful 607, the step voltage is added to the previous programming voltage 609. This new programming voltage pulse is generated 601 and the programming 601, negative voltage pulse 603, and verify pulse 605 are repeated until the selected memory cell is programmed.

Figure 7:
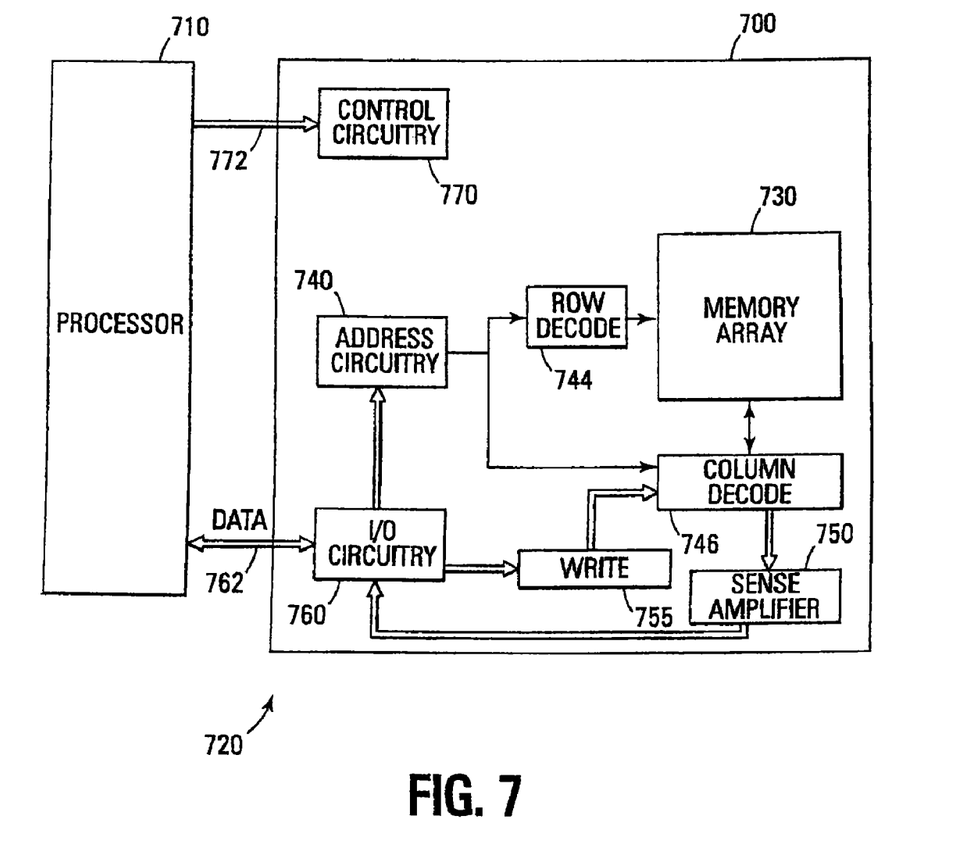
FIG. 7 shows block diagram of one embodiment of a memory system that incorporates the method for quick charge loss compensation.

FIG. 7 illustrates a functional block diagram of a memory device 700. The memory device 700 is coupled to an external processor 710. The processor 710 may be a microprocessor or some other type of controlling circuitry. The memory device 700 and the processor 710 form part of a memory system 720. The memory device 700 has been simplified to focus on features of the memory that are helpful in understanding the present invention.

The memory device 700 includes an array 730 of non-volatile memory cells, such as the one illustrated previously in FIG. 3. The memory array 730 is arranged in banks of word line rows and bit line columns. In one embodiment, the columns of the memory array 730 comprise series strings of memory cells. As is well known in the art, the connections of the cells to the bit lines determines whether the array is a NAND architecture, an AND architecture, or a NOR architecture.

Address buffer circuitry 740 is provided to latch address signals provided through the I/O circuitry 760. Address signals are received and decoded by a row decoder 744 and a column decoder 746 to access the memory array 730. It will be appreciated by those skilled in the art, with the benefit of the present description, that the number of address input connections depends on the density and architecture of the memory array 730. That is, the number of addresses increases with both increased memory cell counts and increased bank and block counts.

The memory device 700 reads data in the memory array 730 by sensing voltage or current changes in the memory array columns using sense amplifier circuitry 750. The sense amplifier circuitry 750, in one embodiment, is coupled to read and latch a row of data from the memory array 730. Data input and output buffer circuitry 760 is included for bidirectional data communication as well as address communication over a plurality of data connections 762 with the controller 710. Write circuitry 755 is provided to write data to the memory array.

Memory control circuitry 770 decodes signals provided on control connections 772 from the processor 710. These signals are used to control the operations on the memory array 730, including data read, data write (program), and erase operations. The memory controller circuitry 770 may be a state machine, a sequencer, or some other type of controller to generate the memory control signals. In one embodiment, the memory control circuitry 770 is configured to execute the programming method of the present embodiments in order to reduce the effects of quick charge loss in the memory device.

The flash memory device illustrated in FIG. 7 has been simplified to facilitate a basic understanding of the features of the memory. A more detailed understanding of internal circuitry and functions of flash memories are known to those skilled in the art.

CONCLUSION

In summary, one or more embodiments reduce the effects of quick charge loss in a memory device during a programming operation. In one such embodiment, after a programming pulse is applied to the selected word line, a negative voltage pulse is applied to force trapped electrons from the tunnel oxide. The verify pulse is then applied to determine if the selected memory cells have been programmed to the target threshold voltage.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is intended that this invention be limited only by the following claims and equivalents thereof.

What is claimed is:

1. A method for reducing quick charge loss effect in a memory device, the method comprising:
    applying programming voltage to a selected word line;
    applying a negative voltage to the selected word line; and
    applying a ramped voltage to the selected word line after the negative voltage to determine if memory cells coupled to the selected word line are successfully programmed such that a selected memory cell turns on when the ramped voltage reaches the voltage that is stored in the selected memory cell.

2. The method of claim 1 wherein the selected memory cell turns on when the ramped voltage reaches a target threshold voltage.

3. The method of claim 1 wherein the negative voltage has a magnitude such that electrons trapped in a tunnel oxide of the memory cells coupled to the selected word line are forced out.

4. The method of claim 1 wherein the programming voltage is part of an incrementally increasing series of programming pulses.

5. The method of claim 4 wherein each subsequent programming pulse is increased from the previous programming pulse by a step voltage.

6. A method for programming, the method comprising:
    applying a programming voltage to a selected word line coupled to a plurality of selected memory cells;
    applying a negative voltage to the selected word line subsequent to the programming voltage;
    applying a ramped voltage to the selected word line wherein the ramped voltage ramps until reaching a voltage to which at least one of the plurality of selected memory cells are programmed;
    applying ground potential to unselected word lines; and
    if the plurality of selected memory cells have not been programmed to their respective target threshold voltages, repeating the application of the programming voltage, the negative voltage, and the ramped voltage until the plurality of selected memory cells are programmed to their respective target threshold voltages, wherein the programming voltage is incrementally increased prior to each repetition.

7. The method of claim 6 and further comprising biasing each bit line coupled to a memory cell being programmed with an enable voltage.

8. The method of claim 7 wherein the enable voltage includes a range of 0.2V to 1.2V.

9. The method of claim 6 wherein the negative voltage is a negative pulse in a range of −5V to −6V.

10. The method of claim 6 wherein upper and lower pages of each memory cell are programmed.

11. A non-volatile memory device comprising:
an array of non-volatile memory cells; and
control circuitry coupled to the array of non-volatile memory cells, wherein the control circuitry is configured to control a programming operation such that a negative voltage is applied to a selected memory cell after a programming voltage, the control circuitry further configured to control a ramped voltage applied to the selected memory cell after the negative voltage such that the control circuitry is configured to cause the ramped voltage to increase until reaching a voltage to which the selected memory cell is programmed such that the selected memory cell turns on.

12. The memory device of claim 11 wherein the memory array comprises one of a NAND, a NOR, or an AND architecture.

13. The memory device of claim 11 wherein each of the plurality of memory cells comprises a tunnel oxide.

14. The memory device of claim 13 wherein the negative voltage has a magnitude that forces electrons from the tunnel oxide but is less than a voltage that causes the selected memory cell to be erased.

15. A system comprising:
controlling circuitry configured to control operation of the system; and
a non-volatile memory device coupled to the controlling circuitry, the memory device comprising:
a memory array comprising a plurality of memory cells; and
memory control circuitry coupled to the memory array, wherein the memory control circuitry is configured to receive a program command from the controlling circuitry and control application of a programming voltage to control gates of selected memory cells, control application of a negative voltage to the control gates of the selected memory cells subsequent to the programming voltage, and control application of a ramped voltage to the control gates of the selected memory cells such that the ramped voltage increases until reaching a voltage to which the selected memory cells are programmed such that the selected memory cells turn on.

16. The memory system of claim 13 wherein the plurality of memory cells are flash memory cells comprising floating gate charge storage elements.

17. The memory system of claim 13 wherein the control gates of the plurality of memory cells are coupled to word lines and bit lines are coupled to series strings of memory cells.

18. The memory system of claim 13 wherein the plurality of memory cells are configured to be programmed with odd and even pages of data.

* * * * *

UNITED STATES PATENT AND TRADEMARK OFFICE
CERTIFICATE OF CORRECTION

PATENT NO. : 8,213,233 B2  
APPLICATION NO. : 13/236765  
DATED : July 3, 2012  
INVENTOR(S) : Vishal Sarin et al.

It is certified that error appears in the above-identified patent and that said Letters Patent is hereby corrected as shown below:

On the Title page, in field (57), under "Abstract", in column 2, line 2, after "programming, memory devices," delete "memory devices,".

Signed and Sealed this  
Twenty-eighth Day of August, 2012

David J. Kappos  
*Director of the United States Patent and Trademark Office*